United States Patent
Chadha et al.

(10) Patent No.: US 12,542,260 B2
(45) Date of Patent: Feb. 3, 2026

(54) SURFACE TOPOLOGIES OF ELECTROSTATIC SUBSTRATE SUPPORT FOR PARTICLE REDUCTION

(71) Applicant: Applied Materials, Inc., Santa Clara, CA (US)

(72) Inventors: Arvinder Manmohan Singh Chadha, San Jose, CA (US); Christopher Beaudry, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 421 days.

(21) Appl. No.: 18/081,388

(22) Filed: Dec. 14, 2022

(65) Prior Publication Data

US 2024/0203705 A1  Jun. 20, 2024

(51) Int. Cl.
   *H01L 21/68* (2006.01)
   *G03F 7/20* (2006.01)
   *H01J 37/32* (2006.01)

(52) U.S. Cl.
   CPC ........ *H01J 37/32715* (2013.01); *G03F 7/202* (2013.01); *H01J 2237/2007* (2013.01); *H01J 2237/332* (2013.01)

(58) Field of Classification Search
   CPC ........ H01J 37/32715; H01J 2237/2007; H01L 21/68; H01L 21/683
   See application file for complete search history.

(56) References Cited

U.S. PATENT DOCUMENTS

| | | | |
|---|---|---|---|
| 7,672,110 B2 | 3/2010 | Sun et al. | |
| 10,020,218 B2 | 7/2018 | Boyd, Jr. et al. | |
| 10,654,147 B2 | 5/2020 | Boyd, Jr. et al. | |
| 2005/0287445 A1 | 12/2005 | Liu | |
| 2016/0036355 A1* | 2/2016 | Moriya | H01L 21/6831 361/234 |
| 2017/0162552 A1* | 6/2017 | Thompson | H10H 20/825 |
| 2018/0148835 A1 | 5/2018 | Erickson et al. | |
| 2019/0067899 A1* | 2/2019 | Tsuji | H01S 5/183 |
| 2020/0135530 A1 | 4/2020 | Shah et al. | |
| 2021/0036187 A1* | 2/2021 | Lee | H10H 20/01 |
| 2024/0203705 A1* | 6/2024 | Chadha | G03F 7/202 |
| 2025/0101580 A1* | 3/2025 | Hong | C23C 16/45565 |

FOREIGN PATENT DOCUMENTS

| | | |
|---|---|---|
| JP | 2012-009720 A | 1/2012 |
| KR | 2020-0045608 A | 5/2020 |

OTHER PUBLICATIONS

International Search Report and Written Opinion dated Jan. 26, 2024 for Application No. PCT/US2023/035024.

* cited by examiner

*Primary Examiner* — Lee D Wilson
(74) *Attorney, Agent, or Firm* — Patterson + Sheridan, LLP

(57) ABSTRACT

A substrate support for use in a processing chamber to hold a substrate thereon includes a substrate support body, and a plurality of mesas on recessed surfaces of the substrate support body, wherein heights of the plurality of mesas from the recessed surfaces vary over the substrate support body between at least two different heights.

17 Claims, 10 Drawing Sheets

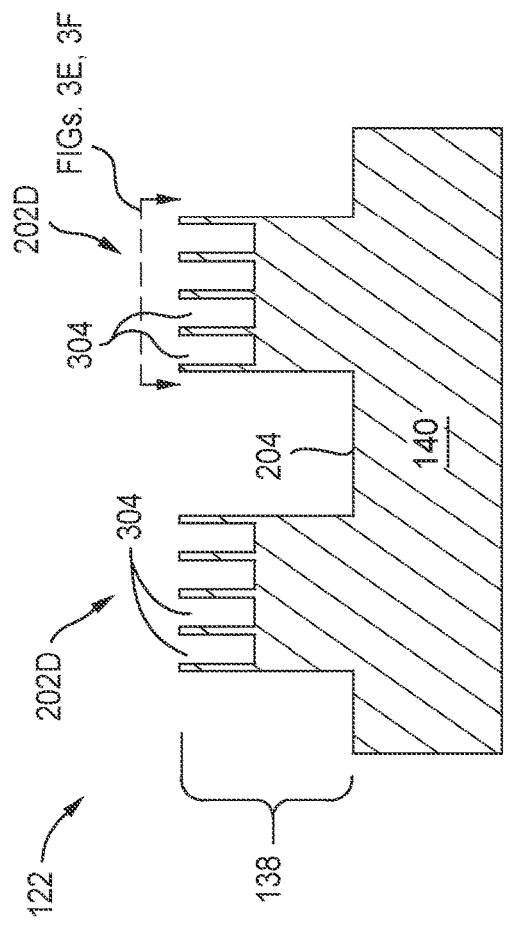
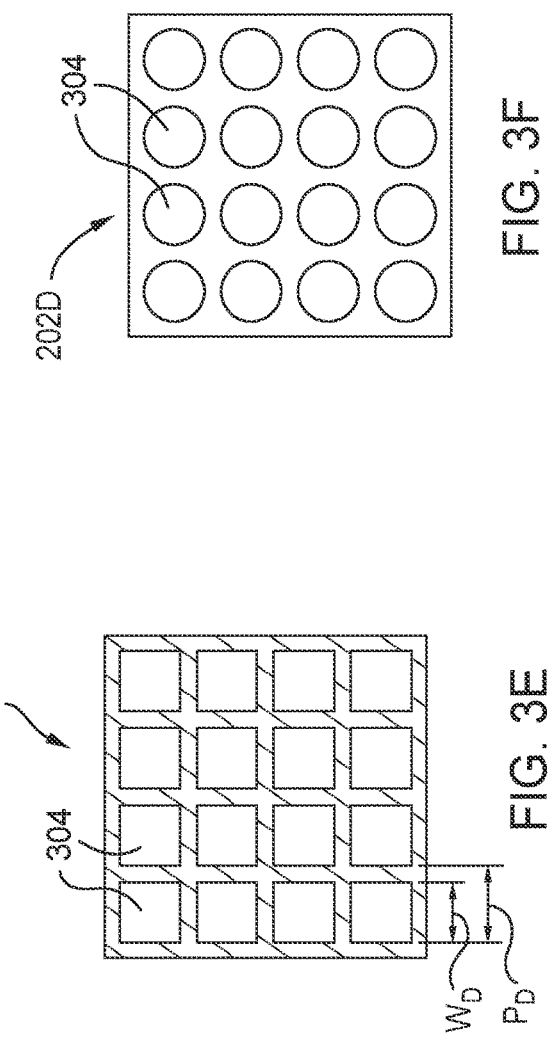

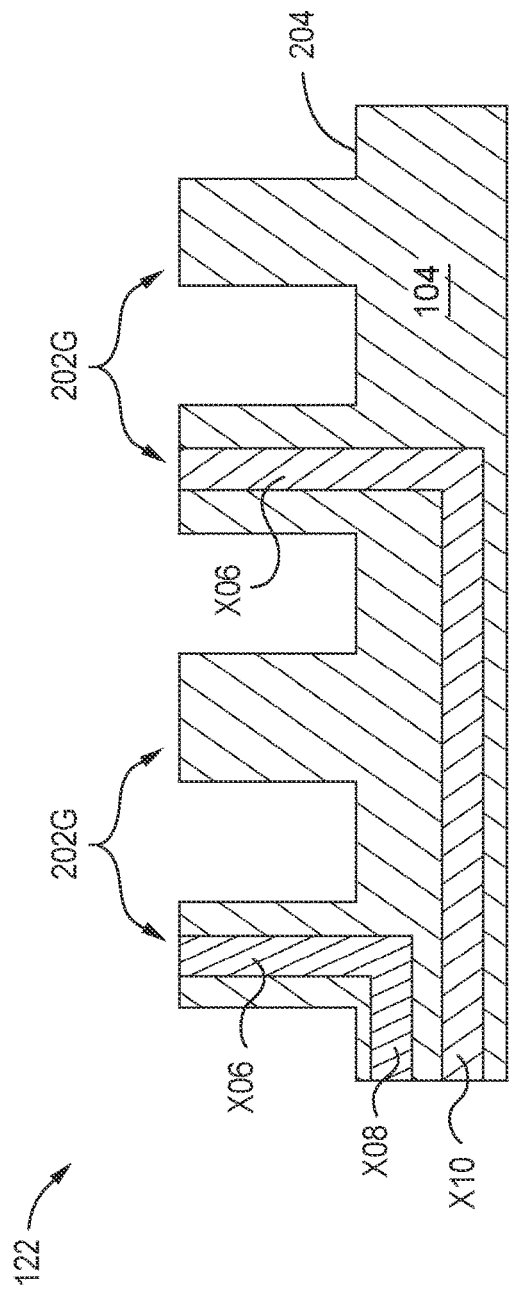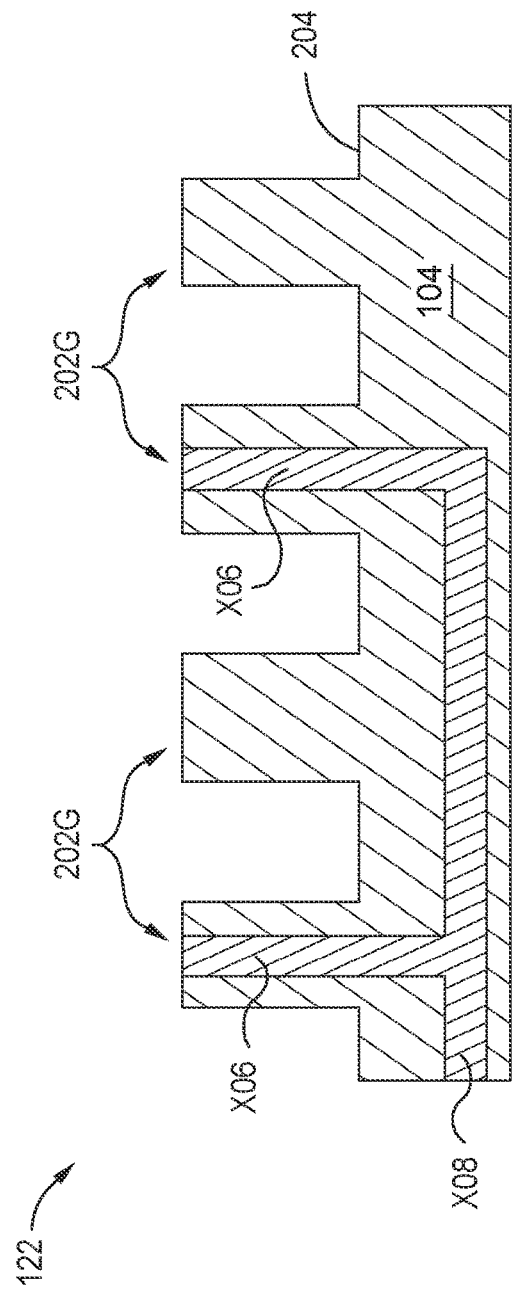

SURFACE TOPOLOGIES OF ELECTROSTATIC SUBSTRATE SUPPORT FOR PARTICLE REDUCTION

BACKGROUND

Field

Embodiments described herein generally relate to an electrostatic chuck (ESC) substrate support for use in a processing chamber to hold and secure a substrate thereon.

Description of the Related Art

Electrostatic chuck (ESC) substrate supports are commonly used in semiconductor manufacturing to securely hold a substrate in a processing position, within a processing volume of a processing chamber. A substrate is typically disposed and clamped on elevated features, such as mesas, on a surface of the substrate support by means of an electrostatic chucking force. However, friction between the elevated features and a backside surface of a substrate disposed thereon due to hard clamping and/or coefficient of thermal expansion (CTE) mismatch between the elevated features and the backside surface of the substrate cause production of particulate materials, such as aluminum (Al), silicon (Si), nitrogen (N), oxygen (O), and halogens, from the elevated features. Particulate materials produced from the substrate support may contaminate the backside surface and a front side surface of the substrate and/or other substrates to be processed in the processing chamber, causing defects on the substrate and impacting performance and device yield.

Therefore, there is a need for an improved substrate support to reduce undesirable production of particulate materials from the substrate support at a backside surface of a substrate disposed on the substrate support.

SUMMARY

Embodiments of the present disclosure provide a substrate support for use in a processing chamber to hold a substrate thereon. The substrate support includes a substrate support body, and a plurality of mesas on recessed surfaces of the substrate support body, wherein heights of the plurality of mesas from the recessed surfaces vary over the substrate support body between at least two different heights.

Embodiments of the present disclosure also provide a substrate support for use in a processing chamber to hold a substrate thereon. The substrate support includes a substrate support body, and a plurality of elevated features on recessed surfaces of the substrate support body, one or more elevated features of the plurality of elevated features having one or more fine features formed therein.

Embodiments of the present disclosure further provide a method of forming substrate support for use in a processing chamber to hold a substrate thereon. The method includes performing a lithography process to form a gray scale mask on a surface of a substrate support body, and performing a material removal process to form first features on the surface of the substrate support body, using the gray scale mask.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3D is an enlarged cross-sectional view of a portion of a substrate support including two mesas, according to one or more embodiments. FIG. 3E is an enlarged top view of the mesa shown in FIG. 3D, according to one embodiment. FIG. 3F is an enlarged top view of the mesa shown in FIG. 3D, according to one embodiment.

FIGS. 3G and 3H are enlarged cross-sectional views of a portion of a substrate support including four mesas, according to certain embodiments.

To facilitate understanding, identical reference numerals have been used, wherever possible, to designate identical elements that are common to the figures.

DETAILED DESCRIPTION

Embodiments described herein generally relate to an electrostatic chuck (ESC) substrate support for use in a processing chamber to hold and secure a substrate thereon. The embodiments described herein provide various topologies of elevated features of the substrate support that decreases a physical contact area between the elevated features and a substrate disposed thereon, as compared to that of elevated features of a conventional substrate support, thereby reducing particle contamination. Topologies of the elevated features can be changed, for example, by contouring a deflection of a substrate, to optimize a chucking voltage to clamp a substrate and enable optimal clamping voltage to prevent over clamping.

Processing Chamber

Figure 1:
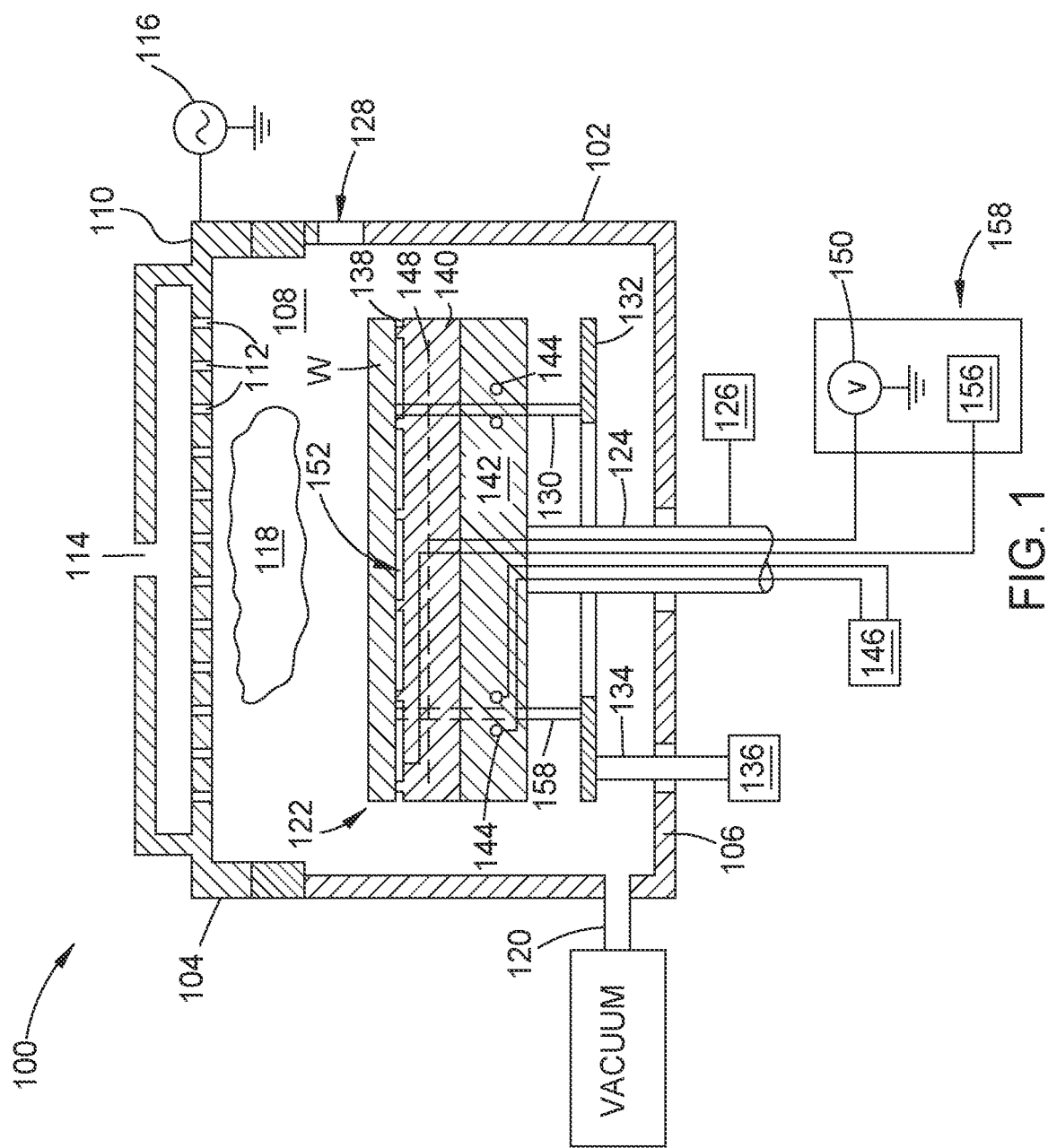
FIG. 1 is a schematic cross-sectional view of a processing chamber with a substrate support disposed therein, according to one or more embodiments of the present disclosure.

FIG. 1 is a schematic cross-sectional view of a processing chamber 100 with a substrate support disposed therein, according to one or more embodiments of the present disclosure. The processing chamber 100 may be a deposition chamber, such as a plasma-enhanced chemical vapor deposition (PECVD) chamber, a plasma-enhanced atomic layer deposition (PEALD) chamber, a plasma treatment chamber, or a plasma doping (PLAD) chamber, or an etch chamber, such as a plasma etch chamber.

The processing chamber 100 includes sidewalls 102, a chamber lid 104, and a chamber bottom 106, which define a processing volume 108. A gas distributer 110 (commonly referred to as a showerhead) having openings 112 disposed therethrough, is disposed in the chamber lid 104 and is used to uniformly distribute processing gases from a gas inlet 114 into the processing volume 108. The gas distributer 110 is coupled to a first power supply 116, such as an RF or VHF power supply, which supplies the power to ignite and maintain a processing plasma 118 composed of the processing gases through capacitive coupling therewith. The processing volume 108 is fluidly coupled to a chamber exhaust, such as to one or more dedicated vacuum pumps (not shown), through a vacuum outlet 120, which maintains the processing volume 108 at sub-atmospheric conditions and evacuates processing and other gases therefrom. A substrate support 122, disposed in the processing volume 108, is supported on a support shaft 124 sealingly extending through the chamber bottom 106. In the embodiments in which the processing chamber is a deposition chamber, a first controller 126 controls a lift, such as a linear motor, stepper motor and gears, or other mechanism, to control raising and lowering of the support shaft 124, and the substrate support 122 supported thereon, to facilitate placement of, and removal of, a substrate W with respect to the processing volume 108 of the processing chamber 100.

A substrate W is loaded into, and removed from, the processing volume 108 through an opening 128 in one of the sidewalls 102, which is conventionally sealed with a door or a valve (not shown) during substrate processing. In the embodiments in which the processing chamber 100 is a deposition chamber, lift pins 130 disposed above, but engageable with, a lift pin hoop 132 are movably disposed through the substrate support 122 to facilitate transferring of a substrate W thereto and therefrom. The lift pin hoop 132 is coupled to a lift hoop shaft 134 sealingly extending through the chamber bottom 106, which raises and lowers the lift pin hoop 132 by means of an actuator 136. When the lift pin hoop 132 is in a raised position, the lift pins 130 are contacted from below and moved to extend above a patterned surface 138 of a substrate support body 140 lifting the substrate W therefrom and enabling access to the substrate W by a robot handler (not shown). When the lift pin hoop 132 is in a lowered position, the tops of the lift pins 130 are flush with, or below, the patterned surface 138 and the substrate W rests on the mesas thereof.

Typically, the substrate support 122 includes a cooling base 142 that is thermally coupled to the substrate support body 140. The cooling base 142 is used to regulate the temperature of the substrate support 122, and a substrate W disposed on the substrate support 122, during processing. The cooling base 142 herein includes one or more fluid conduits 144 disposed therein that are fluidly coupled to, and in fluid communication with, a coolant source 146, such as a refrigerant source or water source. Typically, the cooling base 142 is formed of a corrosion resistant thermally conductive material, such as a corrosion resistant metal, for example aluminum, an aluminum alloy, or stainless steel, and is thermally coupled to the substrate support body 140 with an adhesive or by mechanical means.

The substrate support body 140 is formed from a dielectric material, such as a bulk sintered ceramic material, for example, silicon carbide (SiC), or a metal oxide or metal nitride ceramic material, for example, aluminum oxide ($Al_2O_3$), aluminum nitride (AlN), titanium oxide (TiO), titanium nitride (TiN), yttrium oxide ($Y_2O_3$), mixtures thereof, and combinations thereof. Typically, the substrate support body 140 includes a chucking electrode 148 embedded therein, which secures the substrate W to the patterned surface 138 of the substrate support body 140 by providing a voltage between the substrate W and the chucking electrode 148. The voltage between the substrate W and the chucking electrode 148 result in an electrostatic chucking (ESC) force therebetween. The chucking electrode 148 herein is electrically coupled to a second power supply 150, such as a DC power supply, which provides a chucking voltage thereto between about −5000 V and about +5000. An inert thermally conductive gas, typically helium, is provided to a backside volume 152 disposed between recessed surfaces of the substrate support 122 and a backside surface of a substrate W disposed thereon. Typically, the inert thermally conductive gas is provided to the backside volume 152 through gas ports 154 (shown in FIG. 2) formed in the substrate support body 140 and in fluid communication with a backside gas supply 156. The thermally conductive inert gas thermally couples the substrate W to the substrate support 122 and increases the heat transfer therebetween. Herein, a second controller 158 is used to maintain the gas pressure in the backside volume 152 between about 1 Torr and about 100 Torr, such as between about 1 Torr and about 20 Torr, during plasma processing of the substrate W. In some embodiments, the substrate support 122 further includes one or more sensors (not shown) that measure the deflection of the substrate W when a chucking force is applied thereto. The deflection of the substrate W is communicated to the second controller 158 which determines the chucking force on the substrate W and adjusts the chucking voltage provided to the chucking electrode 148 accordingly.

Substrate Support

Figure 2:
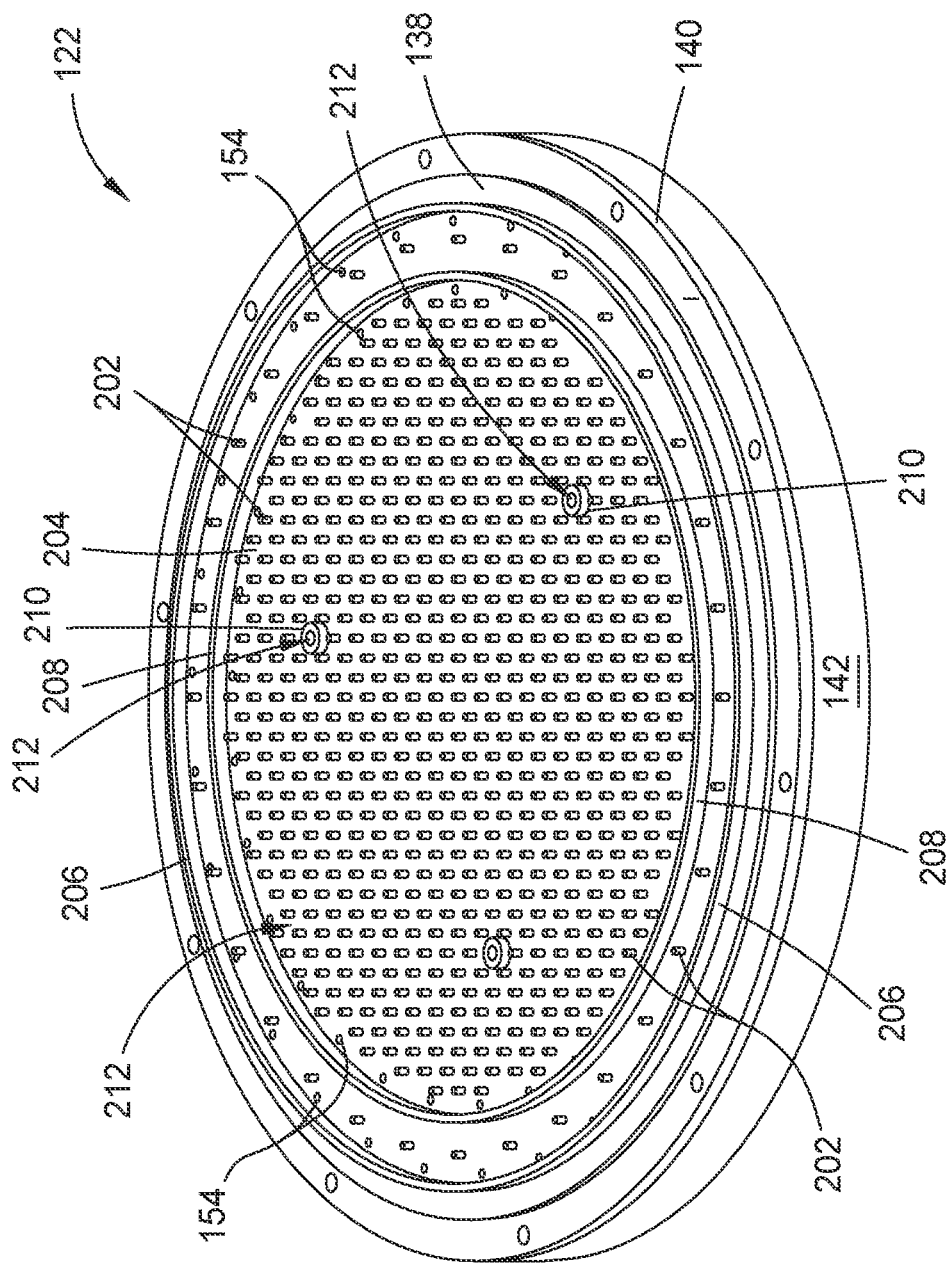
FIG. 2 is a schematic isometric view of a substrate support, according to one or more embodiments of the present disclosure.

FIG. 2 is a schematic isometric view of the substrate support 122, according to one or more embodiments of the present disclosure. The patterned surface 138 of the substrate support body 140 includes elevated features that are mesas 202 extending from recessed surfaces 204 of the substrate support body 140. The mesas 202 may be formed of the same material as the substrate support body 140, such as ceramic material. In some embodiments, the mesas 202 may be different material, such as a hard coating or a different ceramic material, having higher hardness than the substrate support body 140, for example having a Vickers hardness of 10 GPa or more. The patterned surface 138 further includes one or more outer sealing bands, such as a first outer sealing band 206, a second outer sealing band 208, and inner sealing bands 210. The first outer sealing band 206 is concentrically disposed about the center of the patterned surface 138 and proximate to an outer circumference thereof and the second outer sealing band 208 is concentrically disposed about the center of the patterned surface 138 proximate to, and radially inward of, the first outer sealing band 206. Each of the inner sealing bands 210 are coaxially disposed about respective lift pin openings 212 formed within the substrate support body 140. The mesas 202, the recessed surfaces 204, and a backside surface of a substrate W, define the boundary surfaces of the backside volume 152 (shown in FIG. 1) when the substrate W is chucked to the patterned surface 138 of the substrate support body 140.

The mesas 202 may each have a height of between about 1 μm and about 5 mm, for example, about 10 μm, from the recessed surfaces 204. The mesas 202 may each be of a cylindrical shape or a quadrangular prism shape having a width P of between about 20 μm and about 20 mm. A spacing between adjacent mesas 202 may be between about 20 μm and about 20 mm.

In the embodiments described herein, topologies of the mesas 202 are designed such that an area of contact between the substrate support 122 and a substrate W disposed thereon is reduced while the substrate W is securely clamped to the substrate support 122.

Elevated Features on Substrate Support Body

Figure 3C:
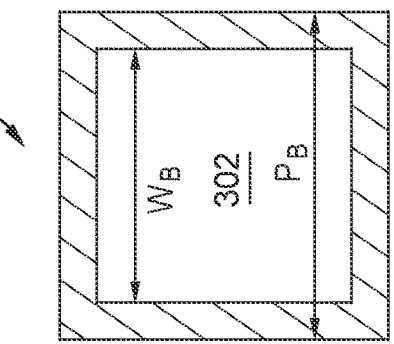
FIG. 3C is an enlarged top view of a portion of the mesa shown in FIG. 3B.
Figure 3A:
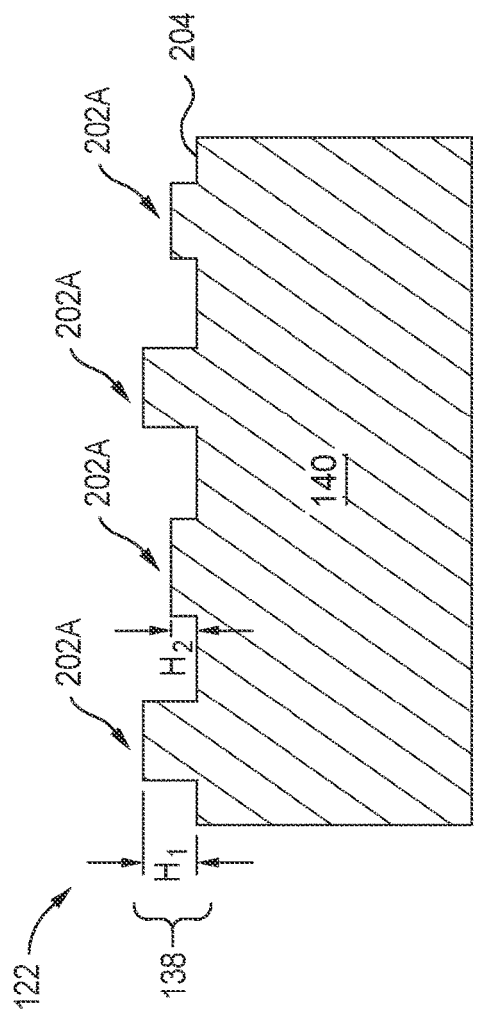
FIG. 3A is an enlarged cross-sectional view of a portion of a substrate support including four mesas, according to one embodiment.

FIG. 3A is an enlarged cross-sectional view of a portion of the substrate support 122 including four mesas 202A, according to one embodiment. In this embodiment, heights of the mesas 202A from the recessed surfaces 204 vary over the patterned surface 138 of the substrate support body 140. The height variation may be radially at different radial and azimuthal distances from the center of the patterned surface 138 of the substrate support body 140. The mesas 202A may have at least two different heights $H_1$ and $H_2$ from the recessed surfaces 204, for example, the height $H_1$ of between about 1 μm and about 5 mm, and the height $H_2$ of between about 1 μm and about 5 mm, the height difference of between about 0.1 μm and about 5 mm. A contact area of the mesas 202A with a substrate W disposed thereon is reduced as compared to that of mesas having the same height, for example, less than about 20% of a backside surface area of the substrate W, and thus particle contamination of a backside surface of the substrate W is reduced. Further, since the height topology of the mesas 202A (e.g., with a radially and or azimuthally to the patterned surface 138, or with a height variation contouring a deflection of a substrate W) may conform to a substrate W disposed thereon, a chucking voltage to clamp the substrate W can be minimal, and thus particle contamination on a backside surface of the substrate W can be minimal. Furthermore, height of the mesas 202 can be changed actively by incorporating active materials that exhibit piezo-electricity or piezo-resistivity in the substrate support body 140. For piezoelectric material, an electric field is applied with an inclusion of an electrode (not shown) or an actuator. The electric field induces a stress that deforms the substrate support body 140. When piezo-electric material is placed under mechanical stress, a shifting of the positive and negative charge centers in the material takes place, which then results in an external electrical field. When reversed, an outer electrical field either stretches or compresses the piezo-electric material. For piezo-resistive material, the change in resistivity of the ceramic induces stress that deforms the substrate support body 140.

Figure 3B:
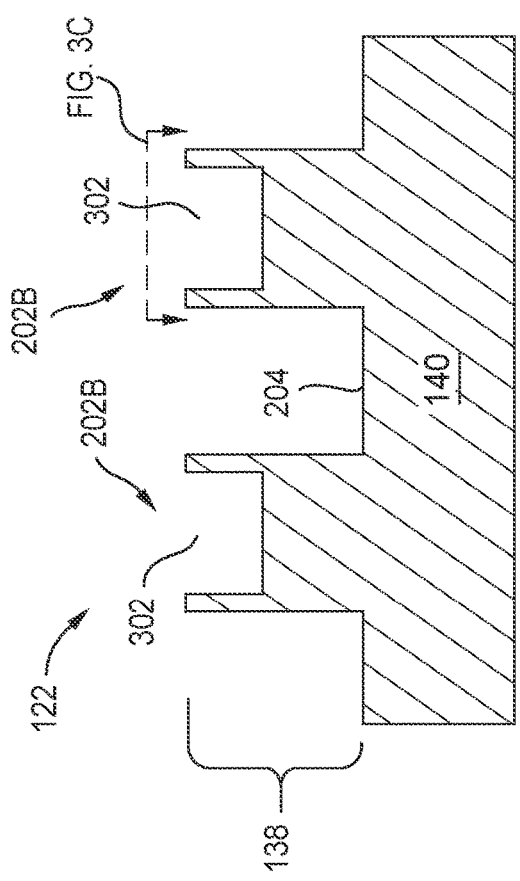
FIG. 3B is an enlarged cross-sectional view of a portion of a substrate support including two mesas, according to one embodiment.

FIG. 3B is an enlarged cross-sectional view of a portion of the substrate support 122 including two mesas 202B, according to one embodiment. FIG. 3C is an enlarged top view of a portion of the mesa 202B shown in FIG. 3B. In this embodiment, the mesas 202B each have a fine feature, such as a hole 302, formed therein. The hole 302 is shown as a partial hole having a depth shorter than the height of the mesa 202B. However, the hole 302 can be a through hole having a depth that is the same as or longer than the height of the mesa 202B. The hole 302 is shown with a square cross section. However, the hole 302 can have a cross section of any other shapes, such as a circle, hexagon, etc. A feature duty cycle, defined as a ratio of a width $W_B$ of the hole 302 to a width $P_B$ of the mesa 202B, may be between about 5% and about 95%. Thus, an area of contact of the mesas 202B with a substrate W disposed thereon is reduced as compared to that of mesas having no fine features formed therein, for example, less than about 20% of a backside surface area of the substrate W, and thus particle contamination of a backside surface of the substrate W is reduced.

FIG. 3D is an enlarged cross-sectional view of a portion of the substrate support 122 including two mesas 202D, according to one or more embodiments. FIG. 3E is an enlarged top view of the mesa 202D shown in FIG. 3D, according to one embodiment. FIG. 3F is an enlarged top view of the mesa 202D shown in FIG. 3D, according to another embodiment. As shown, the mesas 202D each have multiple fine features, such as multiple holes 304, formed therein. The holes 304 may be partial holes, having a depth shorter than the height of the mesas 202D, as shown or through holes, having a depth that is the same as or longer than the height of the mesas 202D. The holes 304 may each have a square cross section, as shown in FIG. 3E, or a circular cross section, as shown in FIG. 3F, or another shape (not shown). A feature duty cycle, defined as a ratio of a width $W_D$ of the hole 304 to a width $P_D$ of the mesa 202D, may be between about 5% and about 95%. Although the holes 304 are arranged in a two-dimensional square lattice in FIGS. 3E and 3F, the holes 304 can be arranged in any other pattern with or without periodicity. An area of contact of the mesas 202D with a substrate W disposed thereon is reduced as compared to that of mesas having no fine features formed therein, and thus particle contamination of a backside surface of the substrate is reduced. Further, the fine features, such as holes 304, formed within the mesas 202B, may change wetting behavior of the patterned surface 138 of the substrate support body 140 such that less particulate materials are produced from the patterned surface on the substrate support body 140.

FIGS. 3G and 3H are enlarged cross-sectional views of a portion of the substrate support 122 including four mesas 202G, according to certain embodiments. In these embodiments, one or more mesas 202G includes a through hole 306 formed therein. The through holes 306 formed through different mesas 202G may be connected to and in fluid communication with respective channels 308, 310 formed within the substrate support body 140, as shown in FIG. 3G, or connected to a common channel 312 formed within the substrate support body 140, as shown in FIG. 3H. The channels 308, 310, 312 are each connected to a gas line (not shown), though which gas flows to tune pressure at a backside surface of the substrate W disposed on the mesas 202G to remove particle contamination of the backside surface of the substrate W. Additionally, gas flow into the channels 308, 310, and 312 can be adjusted to reduce a deflection of the substrate W, and/or to improve thermal uniformity across the substrate W. Gas flow in separate channels 308, 310 can be individually adjusted.

Figure 4:
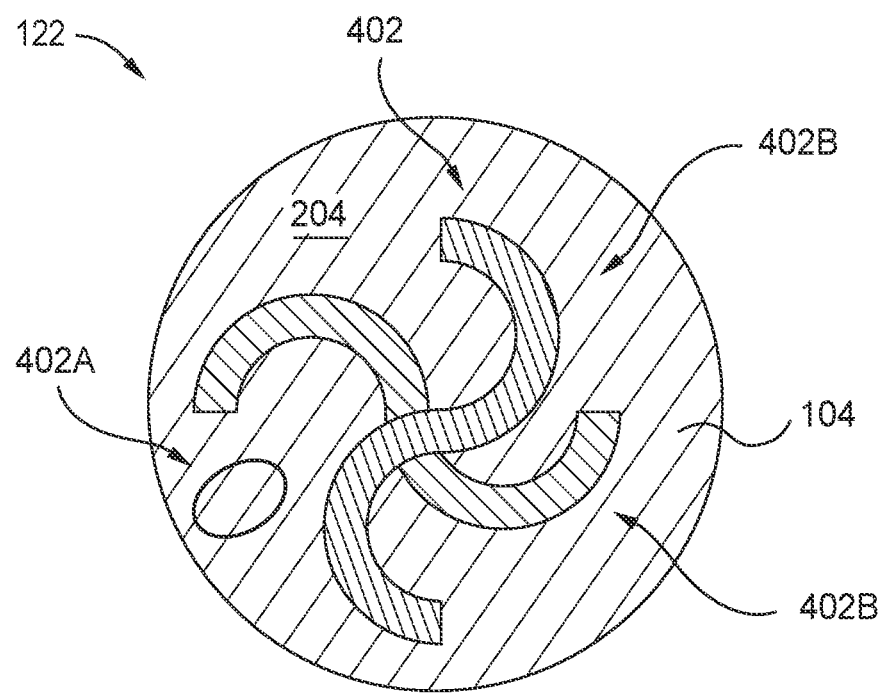
FIG. 4 is a top view of a portion of a substrate support, according to one or more embodiments of the present disclosure.

FIG. 4 is a top view of a portion of the substrate support 122, according to one or more embodiments of the present disclosure. In these embodiments, the elevated feature on the patterned surface 138 are veins 402 extending from recessed surfaces 204 on the substrate support body 140. Although not shown in FIG. 4, the patterned surface 138 may include other components that are shown in FIG. 2, such as the first outer sealing band 206 and the second outer sealing band 208. The same reference numerals are used for the components that are substantially the same as those of the embodiments shown in FIG. 2, and the description of repeated components may be omitted.

The veins 402 are continuous (shown as 402A) or discontinuous (shown as 402B) protrusion from the recessed surfaces 204, and may each have a height of between about 1 μm and about 5 mm, for example, about 10 μm, from the recessed surface 204. The veins 402 may each have a width (i.e., a length measured laterally to the recessed surface 204) of between about 20 μm and about 5 mm. A height and a width can vary among different veins 402 and/or within individual veins 402. Topology of the veins 402 can be designed to reduce a deflection of a substrate W disposed thereon and/or improve thermal uniformity across the substrate W.

Further, the topology of the veins 402 can be designed such that an area of contact between the substrate support 122 and a substrate W disposed thereon is reduced while the substrate W is securely clamped to the substrate support 122. For example, heights of the veins 402 may be varied over the patterned surface 138 of the substrate support body 140, similarly to the height variation of the mesas 202A shown in FIG. 3A. Alternatively, or additionally, as discussed below, one or more veins 402 may have a groove formed therein, similarly to the holes 302 in the mesas 202B as shown in FIGS. 3B and 3C, and the holes 304 in the mesas 202D as shown in FIGS. 3D, 3E. Alternatively, or additionally, one or more veins 402 may have a hole formed therein connected to a channel for gas flow, similarly to the holes 306 in the mesas 202G as shown in FIGS. 3G and 3H.

Figure 5:
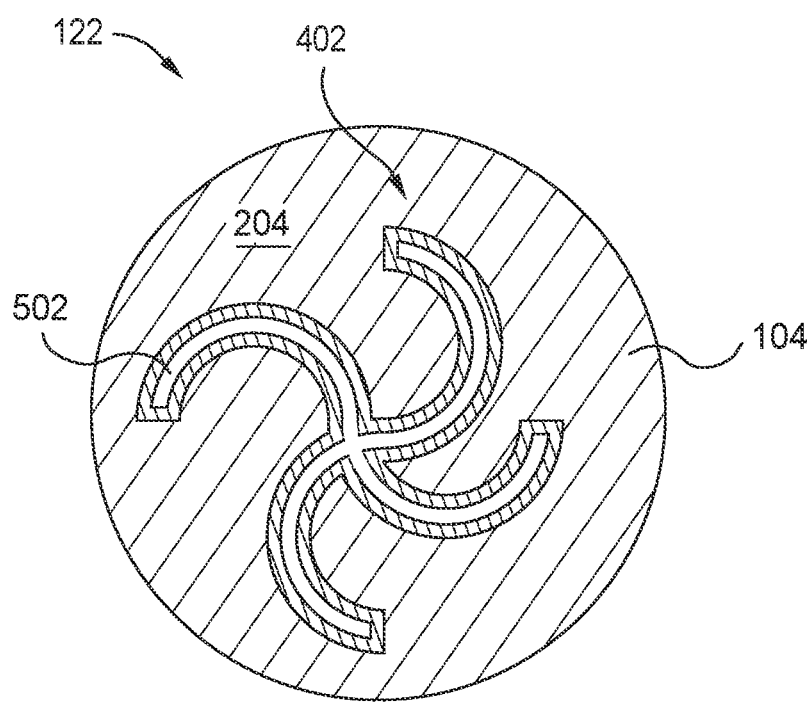
FIG. 5 is a top view of a portion of a substrate support including two veins, according to one embodiment.

FIG. 5 is a top view of a portion of the substrate support 122 including two veins 402, according to one embodiment. In this embodiment, the veins 402 each have a fine feature, such as a groove 502, formed therein. The groove 502 may have a depth shorter or larger than the height of the vein 402. An area of contact of the veins 402 with a substrate W disposed thereon is reduced as compared to that of veins having no fine features formed therein, and thus particle contamination of a backside surface of the substrate W is reduced.

Fabrication of Elevated Features on Substrate Support Body

The elevated features on a substrate support body 140 are formed by a material removal process, such as a bead blasting process or an etching process, with a gray scale mask, a radiation-assisted ablation process, such as laser ablation, or combination thereof. It should be noted that elevated features formed by a radiation-assisted ablation process may maintain crystallinity of the substrate support body 140, which results in less production of particulate materials as compared with a substrate support body having different (e.g., more or less) polycrystallinity.

Figure 6:
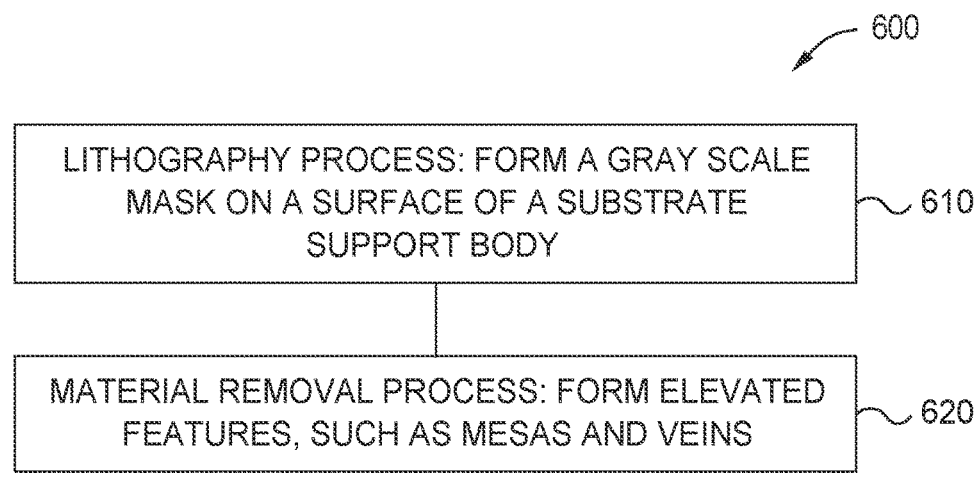
FIG. 6 depicts a process flow diagram of a method of forming elevated features on a surface of a substrate support body, by a material removal process, or a radiation-assisted ablation process, according to one or more embodiments of the present disclosure.
Figure 7A:
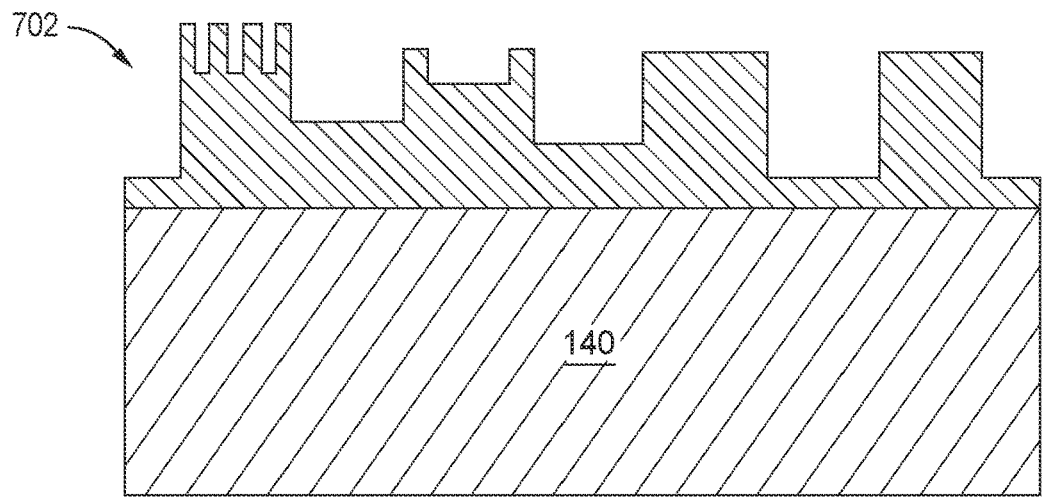
FIGS. 7A and 7B are cross-sectional views of a portion of the substrate support body corresponding to various states of the method shown in FIG. 6.
Figure 7B:
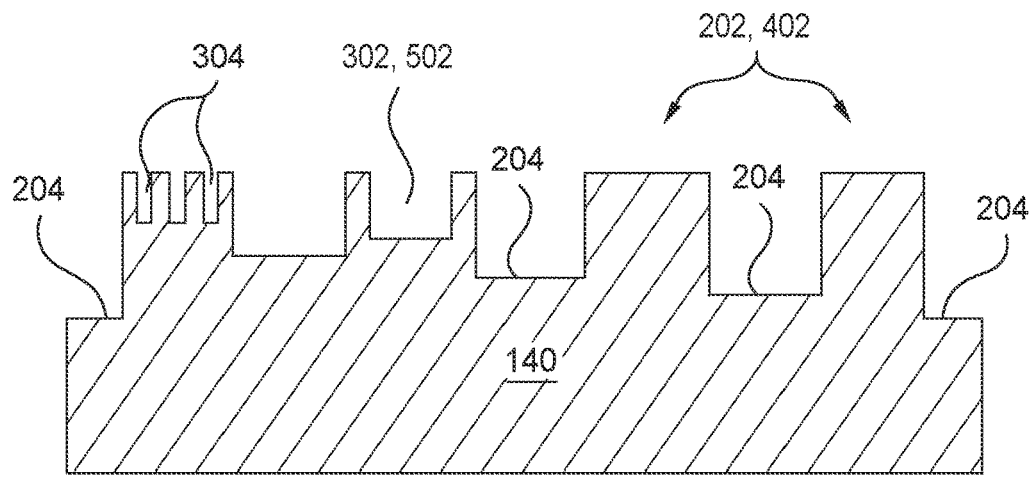

FIG. 6 depicts a process flow diagram of a method 600 of forming elevated features on a surface of the substrate support body 140, by a material removal process, or a radiation-assisted ablation process, according to one or more embodiments of the present disclosure. FIGS. 7A and 7B are cross-sectional views of a portion of the substrate support body 140 corresponding to various states of the method 600.

The method 600 begins with block 610 in which a lithography process is performed to form a gray scale mask 702 on a surface of the substrate support body 140, as shown in FIG. 7A. In the lithography process, a photoresist deposited on the surface of the substrate support body 140 is developed by exposure to locally modulated electromagnetic or thermal radiation, forming the gray scale mask 702 having gradient height photoresist structures corresponding to the desired elevated features to be formed on the surface of the substrate support body 140. In some embodiments, a mask patterned by lithography can be placed on the surface of the substrate support body 140 at predetermined locations.

In block 620, a material removal process is performed to form elevated features, such as mesas 202 and veins 402, as shown in FIG. 7B. The mesas 202 may include a hole 302 or holes 304. The material removal process may be a bead blasting process or an etching process. The veins 402 may include a groove 502. In the material removal process, the gray scale mask 702 is used as a nested mask (having multiple height levels) in dry anisotropic etching or wet etching, where the gradient height photoresist structures are transferred onto the surface of the substrate support body 140. Recessed surfaces 204 having different depths are formed.

Alternative to the lithography process in block 610 and the material removal process in block 620, a radiation-assisted ablation process may be performed to form elevated features, such as mesas 202 and veins 402, and fine features, such a hole 302, holes 304 within the elevated features, as shown in FIG. 7B. The radiation-assisted ablation may include laser ablation. Laser wavelength used in the laser ablation may be extreme ultraviolet (EUV) wavelength, such as 248 nm, ultraviolet (UV) wavelength, such as 355 nm, near infrared (IR) wavelength, such as 1.5 μm, or IR wavelength, such as 10.2 μm. Recessed surfaces 204 and fine features having different depths may be formed by adjusting laser parameters, such as the number of passes, dwell time, and intensity. The radiation source may be a diode array, or an infrared lamp combined with focusing optics, which are mounted on a movable stage to pattern elevated features and fine features.

Figure 8:
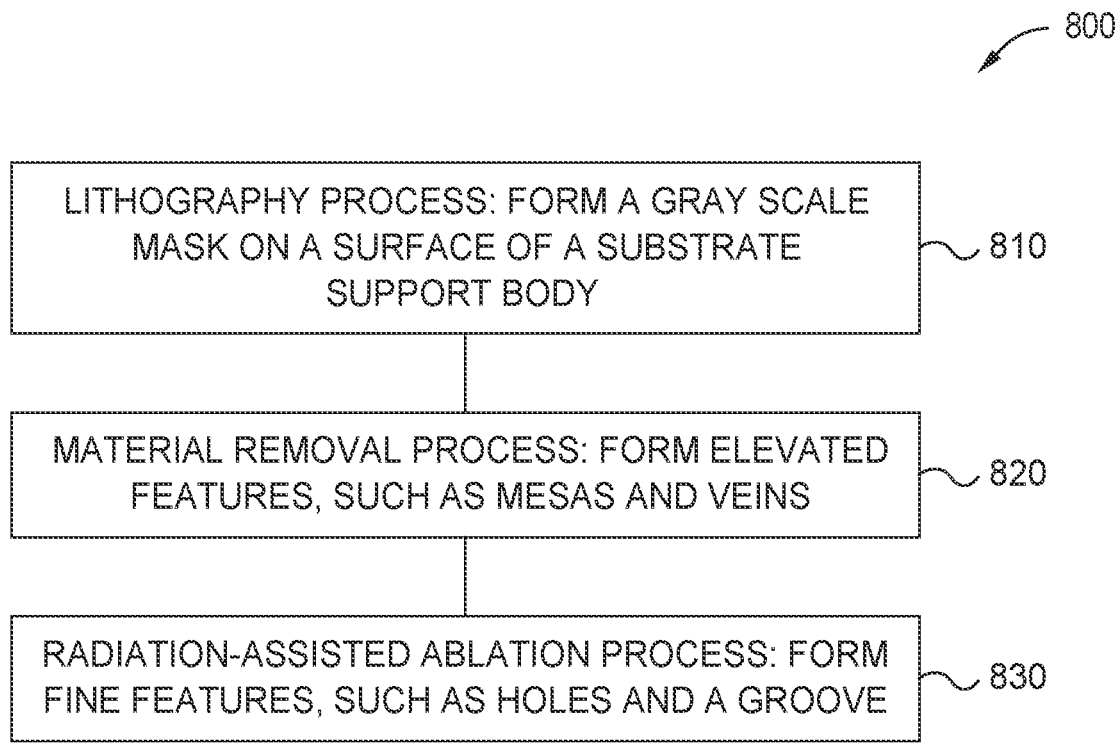
FIG. 8 depicts a process flow diagram of a method of forming elevated features on a surface of a substrate support body, by a combination of a material removal process and a radiation-assisted ablation process, according to one or more embodiments of the present disclosure.
Figure 9A:
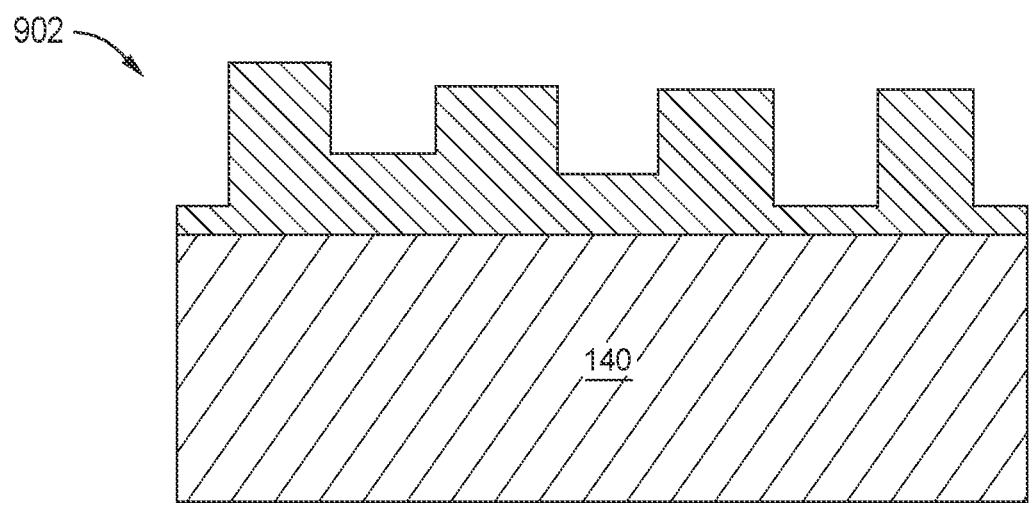
FIGS. 9A, 9B, and 9C are cross-sectional views of a portion of the substrate support body corresponding to various states of the method shown in FIG. 8.
Figure 9B:
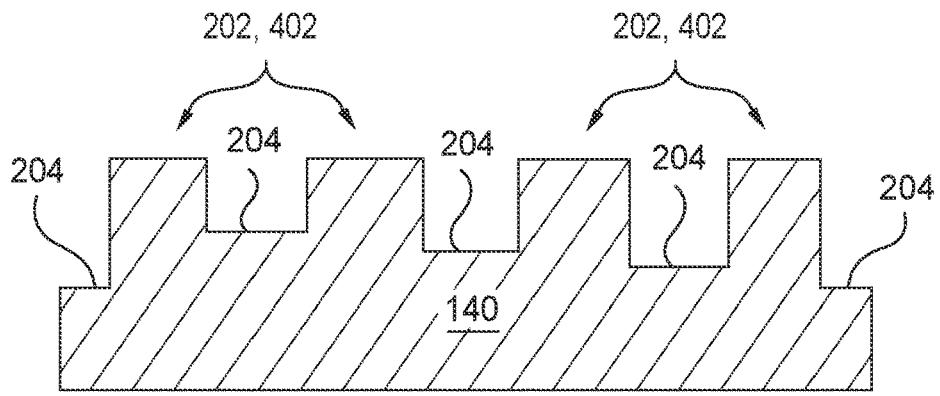
Figure 9C:
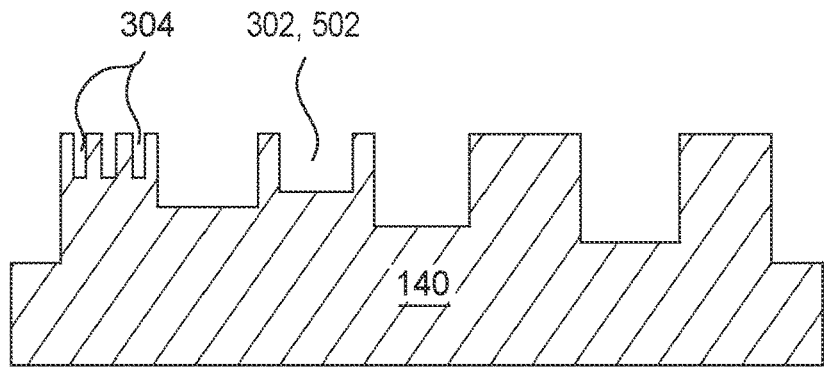

FIG. 8 depicts a process flow diagram of a method 800 of forming elevated features on a surface of the substrate support body 140, by a combination of a material removal process and a radiation-assisted ablation process, according to one or more embodiments of the present disclosure. FIGS. 9A, 9B, and 9C are cross-sectional views of a portion of the substrate support body 140 corresponding to various states of the method 800.

The method 800 begins with block 810 in which a lithography process is performed to form a gray scale mask 902 on a surface of the substrate support body 140, as shown in FIG. 9A. In the lithography process, a photoresist deposited on the surface of the substrate support body 140 is developed by locally modulated exposure to electromagnetic or thermal radiation, forming the gray scale mask 902 having gradient height photoresist structures corresponding to the desired elevated features to be formed on the surface of the substrate support body 140. In some embodiments, a mask patterned by lithography can be placed on the surface of the substrate support body 140 at predetermined locations.

In block 820, a material removal process is performed to form elevated features such as mesas 202 and veins 402, as shown in FIG. 9B. The material removal process may be a bead blasting process or an etching process. In the material removal process, the gray scale mask 902 is used as a nested mask (having multiple height levels) in dry anisotropic etching or wet etching, where the gradient height photoresist structures are transferred onto the surface of the substrate support body 140. Recessed surfaces 204 having different depths are formed.

In block 830, a radiation-assisted ablation process is performed to form fine features, such as a hole 302, holes 304, and a groove 502, as shown in FIG. 9C. The radiation-assisted ablation process may include laser ablation. Laser wavelength used in the laser ablation may be extreme ultraviolet (EUV) wavelength, such as 248 nm, ultraviolet (UV) wavelength, such as 355 nm, near infrared (IR) wavelength, such as 1.5 µm, or IR wavelength, such as 10.2 µm. Holes and grooves having different depths may be formed by adjusting laser parameters, such as the number of passes, dwell time, and intensity. The radiation source may be a diode array, or an infrared lamp combined with focusing optics, which are mounted on a movable stage to pattern fine features.

Figure 10:
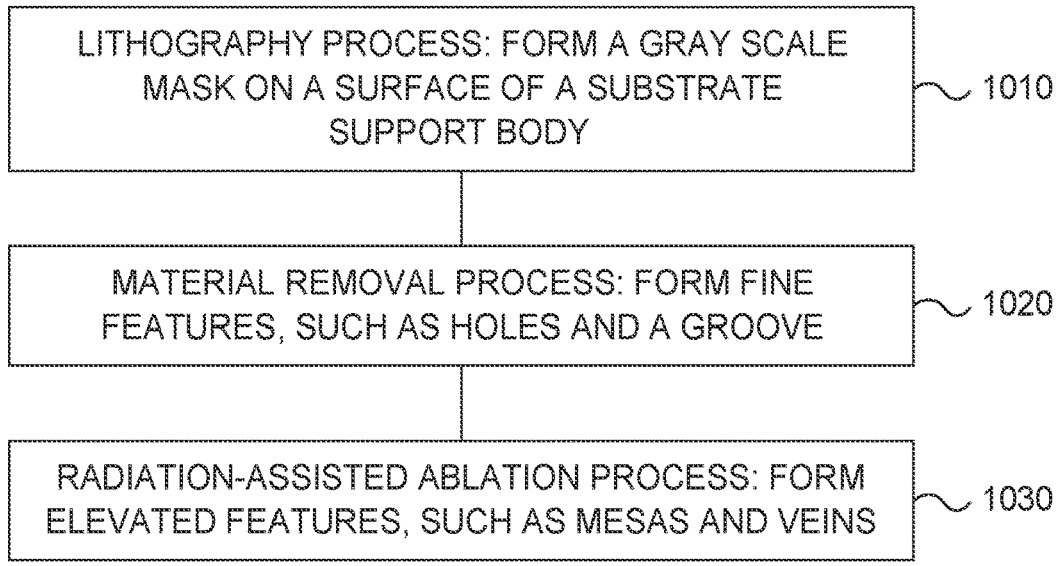
FIG. 10 depicts a process flow diagram of a method of forming elevated features on a surface of a substrate support body, by a combination of a material removal process and a radiation-assisted ablation process, according to one or more embodiments of the present disclosure.
Figure 11A:
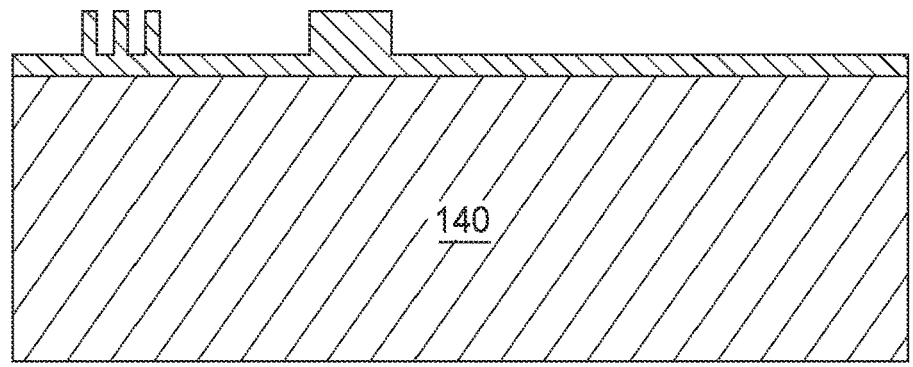
FIGS. 11A, 11B, and 11C are cross-sectional views of a portion of the substrate support body corresponding to various states of the method shown in FIG. 10.
Figure 11B:
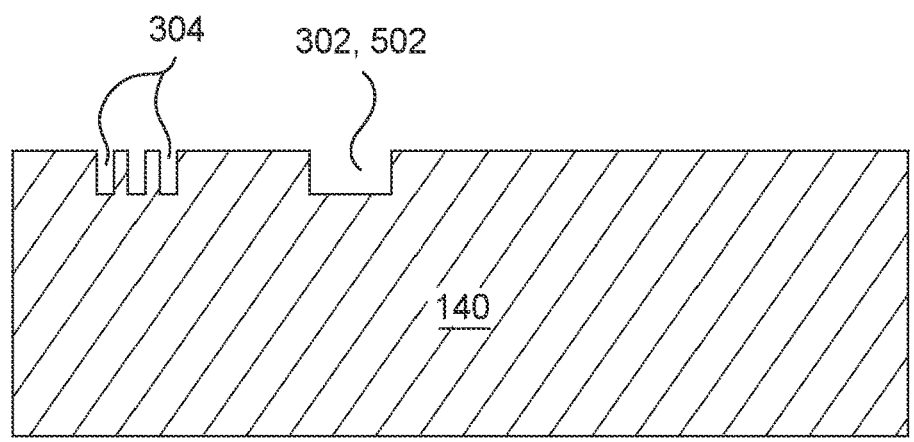
Figure 11C:
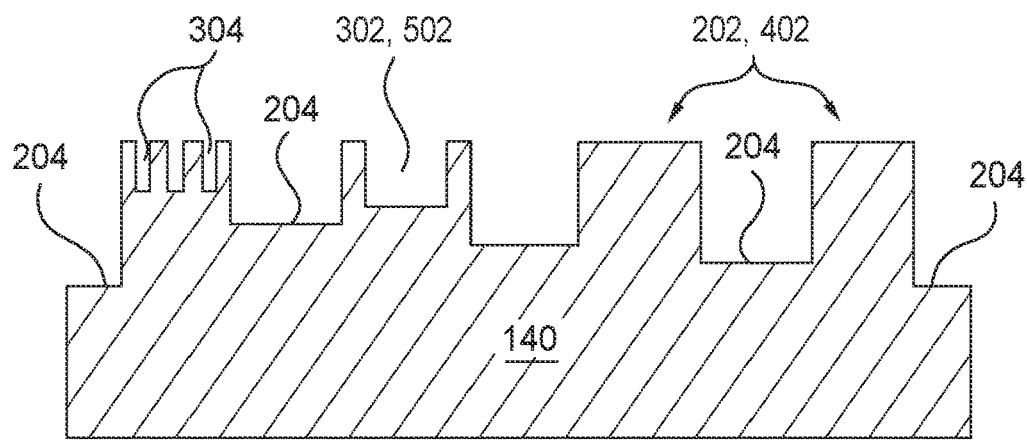

FIG. 10 depicts a process flow diagram of a method 1000 of forming elevated features on a surface of the substrate support body 140, by a combination of a material removal process and a radiation-assisted ablation process, according to one or more embodiments of the present disclosure. FIGS. 11A, 11B, and 11C are cross-sectional views of a portion of the substrate support body 140 corresponding to various states of the method 1000.

The method 1000 begins with block 1010 in which a lithography process is performed to form a gray scale mask 1102 on a surface of the substrate support body 140, as shown in FIG. 11A. In the lithography process, a photoresist deposited on the surface of the substrate support body 140 is developed by locally modulated exposure to electromagnetic or thermal radiation, forming the gray scale mask 1102 having gradient height photoresist structures corresponding to the desired fine features to be formed on the surface of the substrate support body 140. In some embodiments, a mask patterned by lithography can be placed on the surface of the substrate support body 140 at predetermined locations.

In block 1020, a material removal process is performed to form fine features, such a hole 302, holes 304, and a groove 502, as shown in FIG. 11B. The material removal process may be a bead blasting process or an etching process. In the material removal process, the gray scale mask 1102 is used as a nested mask (having multiple height levels) in dry anisotropic etching or wet etching, where the gradient height photoresist structures are transferred onto the surface of the substrate support body 140. Fine features, such as a hole 302, holes 304, and a groove 502, are formed.

In block 1030, a radiation-assisted ablation process is performed to form elevated features, such as mesas 202 and veins 402, as shown in FIG. 11C. The radiation-assisted ablation process may include laser ablation. Laser wavelength used in the laser ablation may be extreme ultraviolet (EUV) wavelength, such as 248 nm, ultraviolet (UV) wavelength, such as 355 nm, near infrared (IR) wavelength, such as 1.5 µm, or IR wavelength, such as 10.2 µm. Recessed surfaces 204 having different depths may be formed by adjusting laser parameters, such as the number of passes, dwell time, and intensity. The radiation source may be a diode array, or an infrared lamp combined with focusing optics, which are mounted on a movable stage to pattern elevated features and fine features.

The substrate support according to the embodiments described herein includes a patterned surface having elevated features that are designed such that an area of contact between the substrate support and a substrate disposed thereon is reduced while the substrate is securely clamped to the substrate support, and thus undesirable production of particulate materials from the substrate support at a backside surface of the substrate is reduced.

While the foregoing is directed to embodiments of the present disclosure, other and further embodiments of the disclosure may be devised without departing from the basic scope thereof, and the scope thereof is determined by the claims that follow.

The invention claimed is:

1. A substrate support for use in a processing chamber, comprising:
   a substrate support body configured to hold a substrate thereon; and
   a plurality of mesas on recessed surfaces of the substrate support body, the plurality of mesas comprising ceramic material, wherein
   the substrate support body comprises active materials that exhibit piezo-electricity or piezo-resistivity to change heights of the plurality of mesas from the recessed surfaces to conform to the substrate.

2. The substrate support of claim 1, wherein
   the substrate support body comprises ceramic material selected from the group consisting of silicon carbide (SiC), aluminum oxide ($Al_2O_3$), aluminum nitride (AlN), titanium oxide (TiO), titanium nitride (TiN), yttrium oxide ($Y_2O_3$), and combinations thereof.

3. The substrate support of claim 1, wherein
   the plurality of mesas comprises material having higher hardness than the substrate support body.

4. The substrate support of claim 1, wherein
   the heights of the plurality of mesas are between 1 µm and 5 mm, and
   height differences different heights of the plurality of mesas are between 1 µm and 5 mm, and
   the plurality of mesas have a width of between 20 µm and 20 mm and a spacing between adjacent mesas of between 20 µm and 20 mm.

5. The substrate support of claim 1, wherein a contact area of the plurality of mesas with a substrate to be disposed thereon is less than 20% of a backside surface area of the substrate.

6. The substrate support of claim 1, wherein the plurality of mesas is formed by a laser ablation process.

7. A substrate support for use in a processing chamber to hold a substrate thereon, comprising:
   a substrate support body; and
   a plurality of mesas on recessed surfaces of the substrate support body, each of the plurality of mesas having elevated elongated features with holes formed therebetween from a top surface of the elevated elongated features.

8. The substrate support of claim 7, wherein
   the substrate support body comprise ceramic material selected from the group consisting of silicon carbide (SiC), aluminum oxide ($Al_2O_3$), aluminum nitride (AlN), titanium oxide (TiO), titanium nitride (TiN), yttrium oxide ($Y_2O_3$), and combinations thereof.

9. The substrate support of claim 7, wherein
the plurality of mesas comprises ceramic material having higher hardness than the substrate support body.

10. The substrate support of claim 7, wherein
the plurality of mesas has height of the plurality of mesas are between 1 μm and 5 mm, a width of between 20 μm and 20 mm and a spacing between adjacent mesas of between 20 μm and 20 mm.

11. The substrate support of claim 10, wherein
the holes are partial holes having a depth shorter than the height of the plurality of mesas from the recessed surfaces.

12. The substrate support of claim 10, wherein
the holes are through holes having a depth longer than the height of the plurality of mesas from the recessed surfaces.

13. The substrate support of claim 12, wherein
the holes are in fluid communication with a channel formed within the substrate support body.

14. The substrate support of claim 7, wherein
the mesas is a plurality of veins having a height of between 1 μm and 5 mm, and a width of between 20 μm and 5 mm.

15. The substrate support of claim 14, wherein
the holes are one or more grooves formed in one or more veins of the plurality of veins.

16. The substrates support of claim 7, wherein a contact area of the plurality of mesas with a substrate to be disposed thereon is less than 20% of a backside surface area of the substrate.

17. The substrate support of claim 8, wherein the plurality of mesas is formed by a laser ablation process.

\* \* \* \* \*